(12) United States Patent
Choi et al.

(10) Patent No.: US 12,406,725 B2
(45) Date of Patent: Sep. 2, 2025

(54) SELF-SELECTING MEMORY DEVICE, MEMORY SYSTEM HAVING THE SAME, AND OPERATING METHOD THEREOF

(71) Applicant: SAMSUNG ELECTRONICS CO., LTD., Suwon-si (KR)

(72) Inventors: Soyeon Choi, Suwon-si (KR); Zhe Wu, Suwon-si (KR); Chungman Kim, Suwon-si (KR); Seunggeun Yu, Suwon-si (KR); Jabin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 18/334,790

(22) Filed: Jun. 14, 2023

(65) Prior Publication Data
US 2024/0177771 A1    May 30, 2024

(30) Foreign Application Priority Data
Nov. 28, 2022   (KR) .................. 10-2022-0161605

(51) Int. Cl.
G11C 13/00   (2006.01)
(52) U.S. Cl.
CPC ...... *G11C 13/0069* (2013.01); *G11C 13/0004* (2013.01); *G11C 13/004* (2013.01)

(58) Field of Classification Search
CPC .................................................. G11C 13/0069
See application file for complete search history.

(56) References Cited

U.S. PATENT DOCUMENTS

| | | | |
|---|---|---|---|
| 7,443,721 B2 | 10/2008 | Kurotsuchi et al. | |
| 10,403,818 B2 | 9/2019 | Yang et al. | |
| 10,748,615 B2* | 8/2020 | Wang | G11C 13/0038 |
| 10,943,649 B2 | 3/2021 | Kim | |
| 10,991,424 B2 | 4/2021 | Lee | |
| 11,018,190 B2 | 5/2021 | Pellizzer | |
| 2019/0259946 A1* | 8/2019 | Makala | H10N 70/826 |
| 2020/0035917 A1 | 1/2020 | Fratin et al. | |
| 2022/0068384 A1 | 3/2022 | Han | |
| 2022/0113892 A1* | 4/2022 | Fugazza | G11C 13/0069 |
| 2022/0319629 A1 | 10/2022 | Ciocchini et al. | |

* cited by examiner

*Primary Examiner* — Douglas King
(74) *Attorney, Agent, or Firm* — Morgan, Lewis & Bockius LLP

(57) ABSTRACT

An operating method of a self-selecting memory device, includes an operation of applying a first write pulse corresponding to a first state to a first memory cell during a first pulse width, and an operation of applying a second write pulse corresponding to a second state to a second memory cell during a second pulse width, wherein the first write pulse and the second write pulse have substantially opposite polarities, wherein the first pulse width is longer than the second pulse width.

17 Claims, 10 Drawing Sheets

SELF-SELECTING MEMORY DEVICE, MEMORY SYSTEM HAVING THE SAME, AND OPERATING METHOD THEREOF

CROSS-REFERENCE TO RELATED APPLICATION(S)

This U.S. non-provisional utility patent application claims priority under 35 U.S.C. § 119 to Korean Patent Application No. 10-2022-0161605, filed on Nov. 28, 2022 in the Korean Intellectual Property Office, the disclosure of which is incorporated by reference in its entirety.

FIELD

The present inventive concept generally relates to semiconductor memories, and more particularly relates to a self-selecting memory device, a memory system having the same, and an operating method thereof.

DISCUSSION

Phase-change memories (PCM) may employ phase-change storage (PCS) materials to store data using physical properties of such materials. Each PCS material may be switched between at least two states, such as between a crystalline state, a metastable state, and/or an amorphous state, by controlling a magnitude and duration of an electrical current or other energy source applied to the phase-change storage material. Thus, a state of the phase-change storage material may be changed to indicate storage of information therein.

SUMMARY

An embodiment of the present inventive concept provides a self-selecting memory device having an optimized sensing margin, a memory system having the same, and an operating method thereof.

According to an embodiment of the present inventive concept, an operating method of a self-selecting memory device includes operations of: applying a first write pulse corresponding to a first state to a first memory cell during a first pulse width; and applying a second write pulse corresponding to a second state to a second memory cell during a second pulse width, wherein the first write pulse and the second write pulse have substantially opposite polarities, and the first pulse width is longer than the second pulse width.

According to an embodiment of the present inventive concept, a self-selecting memory device includes: word-lines; bit-lines; and a plurality of memory cells connected between the word-lines and the bit-lines, wherein each of the plurality of memory cells stores data in a first state indicating a crystallization state and a second state indicating an amorphous state, wherein a polarity direction of a second write pulse applied to a corresponding word-line and a corresponding bit-line when data is stored in the second state and a polarity direction of a first write pulse applied to a corresponding word-line and a corresponding bit-line when data is stored in the first state are substantially opposite to each other, wherein a pulse width of the second write pulse is shorter than a pulse width of the first write pulse.

According to an embodiment of the present inventive concept, a memory system includes: at least one self-selecting memory device having a plurality of memory cells; and a controller controlling the at least one self-selecting memory device, wherein in the at least one self-selecting memory device, polarities of a write pulse and a read pulse are different from each other according to a first state indicating a crystalline state and a second state indicating an amorphous state, and by changing a shape of the write pulse when a write voltage is applied, a phase-change storage material state of memory cells, such as a germanium-antimony-tellurium (Ge—Sb—Te) alloy crystal phase of the memory cells, may be adjusted.

BRIEF DESCRIPTION OF THE DRAWINGS

The above and other embodiments of the present disclosure will be more clearly understood by way of example from the following detailed description of illustrative embodiments, when taken in conjunction with the accompanying drawings, in which.

DETAILED DESCRIPTION

Hereinafter, embodiments of the present inventive concept will be described clearly, by way of example, and in sufficient detail with reference to the accompanying drawings to facilitate understanding by those skilled in the art.

In storage class memories (SCM), a phase-change random-access memory (PRAM) may offer high scalability, non-volatile characteristics, low latency, and high endurance characteristics, based on a 3D cross-point structure. For example, a PRAM may be composed of a phase-change storage (PCS) material layer, such as but not limited to a germanium-antimony-tellurium (Ge—Sb—Te) alloy material serving as a memory through phase changes of the material, and an ovonic threshold switch (OTS) material layer acting as a switch. Both the PCS and OTS material layers may be based on different chalcogenide alloys. In general, chalcogenides may include compounds comprising at least one Group 16 (chalcogen) element of the periodic table, which may itself be anionic, and at least one more electropositive or amphiphilic element, such as a Group 15 element and/or a Group 14 element, without limitation thereto. A self-selecting memory (SSM) may act as both a memory and a switch in a predominantly OTS structure.

A self-selecting memory device according to an embodiment of the present inventive concept may secure a sensing window by additionally inserting a chalcogenide PCS material (e.g., a Ge—Sb—Te alloy) layer into the SSM, which may give the SSM a more pulse-like shape.

Pulse polarities for a first state (e.g., data "0"; set state) and a second state (e.g., data "1"; reset state) may be implemented to be substantially opposite to each other. In an embodiment, in the case of the first state ("0"), the added chalcogenide PCS material (e.g., a Ge—Sb—Te alloy) layer may be crystallized by applying a relatively large pulse width. In the crystallized state, the chalcogenide layer may have a relatively low resistance. In an embodiment, in the case of the second state ("1"), the chalcogenide PCS material layer can be made amorphous by applying a relatively short pulse width. In the amorphous state, the chalcogenide layer may have a relatively high resistance.

In a self-selecting memory device according to an embodiment of the present inventive concept, a difference in resistance between states ("0" and "1") may be increased by adding a chalcogenide layer, such as a phase change material. In addition, a self-selecting memory device according to an embodiment of the present inventive concept may additionally increase a threshold voltage (Vth) by controlling the pulse width, and maximize a sensing window.

Figure 1:
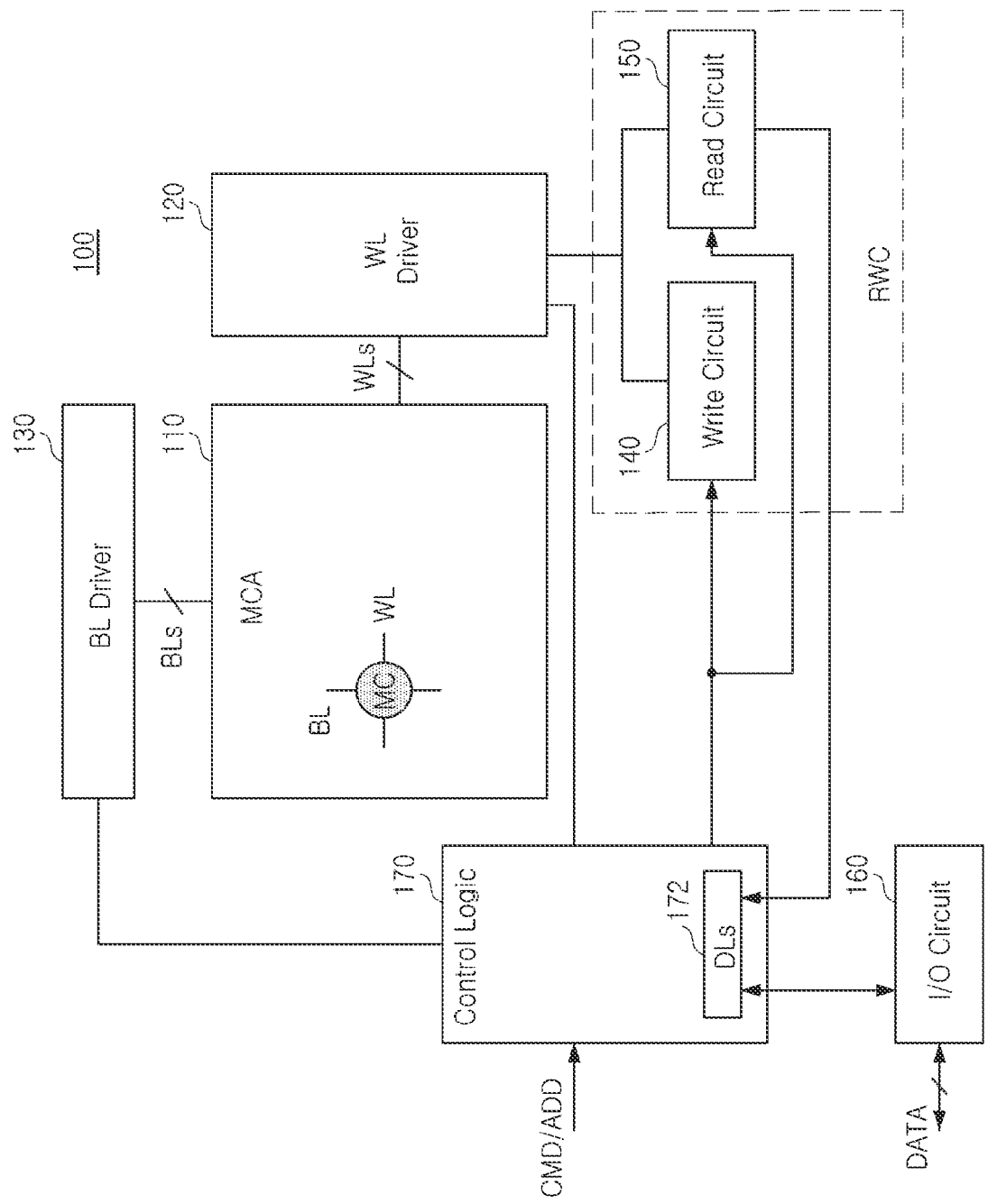
FIG. 1 is a block diagram illustrating a self-selecting memory device 100 according to an embodiment of the present inventive concept.

FIG. 1 illustrates a self-selecting memory device 100 according to an embodiment of the present inventive concept. Referring to FIG. 1, the self-selecting memory device 100 may include a memory cell array (MCA) 110, a word-line selection and driver circuit (WL Driver) 120, a bit-line selection and driver circuit (BL Driver) 130, a write circuit 140, a read circuit 150, an input and output circuit (I/O Circuit) 160, and a control logic circuit (Control Logic) 170.

The memory cell array 110 may be connected to the word-line driver 120 through a plurality of word-lines WL, and connected to the bit-line driver 130 through a plurality of bit-lines BL. In addition, the memory cell array 110 may include a plurality of memory cells (MC) connected to the plurality of word-lines WL and the plurality of bit-lines BL.

As illustrated in FIG. 1, each memory cell MC may be connected between a respective word-line WL and a respective bit-line BL. Here, the memory cell MC may be implemented as a self-selecting memory (SSM). The SSM may include a chalcogenide PCS material (e.g., a Ge—Sb—Te alloy) layer. When the SSM is in a first state ("0"; set state) or low threshold voltage state (LTS), the chalcogenide layer maintains a crystalline phase with low resistance. Accordingly, the threshold voltage is not significantly affected in the first state ("0"). In the case of the second state ("1"; reset state) or high threshold voltage state (HTS), the chalcogenide layer maintains an amorphous state with high resistance. Accordingly, the threshold voltage is additionally increased in the second state ("1"). Thus, a difference between the threshold voltages in the LTS or first state ("0") and in the HTS or second state ("1") increases. This enables an additional margin of security for a sensing window (e.g., a read margin).

The word-line driver 120 may be connected to the memory cell array 110 through word-lines WL. The word-line driver 120 may select one of the word-lines WL using a row address under control of the control logic 170. In addition, the word-line driver 120 may apply a word-line voltage to the selected word-line. Here, the word-line voltage may include a read word-line voltage, a write word-line voltage, and/or the like.

The bit-line driver 130 may be connected to the memory cell array 110 through bit-lines BL. The bit-line driver 130 may select one of the bit-lines BL using a column address under control of the control logic 170. In addition, the bit-line driver 130 may apply a bit-line voltage to the selected bit-line. Here, the bit-line voltage may include a read voltage, a set bit-line voltage, a reset bit-line voltage, and/or the like.

The write circuit 140 may be connected to the word-line driver 120 and the bit-line driver 130. The write circuit 140 may be implemented to perform a write operation such as a set operation or a reset operation on a memory cell connected to a selected bit-line and a selected word-line under control of the control logic 170. For example, the write circuit 140 may apply a word-line voltage to the selected word-line and a bit-line voltage to the selected bit-line in response to a write control signal of the control logic 170. In an embodiment, the write circuit 140 may generate a set pulse or reset pulse corresponding to data to be written during a write operation, and apply the set pulse or reset pulse to the selected word-line and/or bit-line, respectively.

The read circuit 150 may be implemented to read data from memory cells connected to a selected bit-line and a selected word-line under control of the control logic 170. For example, the read circuit 150 may read data from a memory cell MC connected to the selected bit-line BL and the selected word-line WL in response to a read control signal of the control logic 170. In an embodiment, the read circuit 150 may detect a voltage difference between a voltage of the selected word-line and/or bit-line and a reference voltage, and may perform a sensing operation to classify on versus off cells according to the detected voltage difference.

The write circuit 140 and the read circuit 150 may be collectively referred to as a Read Write Circuit (RWC). As illustrated in FIG. 1, the RWC may be disposed below the word-line driver 120, without limitation thereto.

During a write operation, the input and output circuit 160 may be implemented to transfer write data received from an external device (e.g., an external memory controller) to data latches (DL) 172 of the control logic 170 under control of the control logic 170. In addition, the input and output circuit 160 may be implemented to output data read from the data latches 172 to an external device (e.g., the external memory controller) during a read operation.

The control logic 170 may be implemented to control overall operations of the self-selecting memory device 100. The control logic 170 may control the word-line selection and driver circuit 120, the bit-line selection and driver circuit 130, the write circuit 140, the read circuit 150, and/or the input and output circuit 160 in response to a command CMD, an address ADD, and/or control signals input from the outside 150.

In particular, the control logic 170 may select one of a plurality of write modes, and perform a write operation according to the selected write mode. In an embodiment, the control logic 170 may generate a write control signal using the selected write mode, write data, and/or read data, or may generate a read control signal using the selected write mode and/or write data. In an embodiment, the plurality of write modes may perform a write operation in one of a normal mode, a data compare write (DCW) mode, an aggressive data compare write (aDCW) mode, and/or a read skip aggressive data compare write (RDSKIP aDCW) mode. Here, the normal mode is a mode not reflecting a resistance drift, the DCW mode is a mode that reflects a resistance drift for a reset state, and the aDCW mode and the RDSKIP aDCW mode are modes reflecting resistance drifts for both the set and reset states.

During a write operation while operating in the normal mode, the control logic 170 may control the write circuit 140 to perform a set operation or a reset operation according to data to be written to a memory cell. During a write operation while operating in the DCW mode, the control logic 170 may compare the data read from the memory cell by a sensing operation with data to be written, and control the write circuit 140 and the read circuit 150 to perform a set operation or a reset operation according to the comparison result. During a write operation while operating in the aDCW mode, the control logic 170 may compare the data read from the memory cell by a sensing operation with data to be written, and control the write circuit 140 and the read circuit 150 to perform a set operation or a reset operation using the comparison result and the data to be written. In particular, in the write operation in the aDCW mode, when both data to be read and data to be written are data corresponding to a reset state, the write operation need not be performed. During a write operation while operating in the RDSKIP aDCW mode, the control logic 170 may immediately perform a set operation without performing a sensing operation when the data to be written corresponds to a set state, perform a sensing operation when the data to be written does not correspond to the set state, compare the data read from the memory cell with the data to be written from the sensing operation, and determine whether to perform a reset operation or not to perform a write operation using the comparison result and the data to be written, without limitation thereto.

A self-selecting memory device may be implemented as a predominantly OTS structure without a Ge—Sb—Te alloy. In this case, the OTS performs both a data storage function and a switch function substantially simultaneously. During a data storage operation, a state of "0" and/or "1" is distinguished according to pulse polarities for write and read pulses. In the case of state "0," the polarities for write and read pulses are substantially the same; and in the case of state "1," the polarities for write and read pulses are substantially opposite to each other. When a voltage is applied to the OTS, compositional asymmetry occurs inside the OTS. When polarities in write and read pulses are applied in substantially opposite directions, a region rich in a Group 16 chalcogen or anionic element other than that included in the PCS material (e.g., a Ge—Sb—Te alloy), such as but not limited to a selenium-rich (Se-rich) region, is formed in a direction in which electrons move. Accordingly, by forming a relatively high energy barrier, a high threshold voltage (Vth) is required. As a magnitude of the write voltage increases, a degree of Selenium (Se) asymmetry increases. Accordingly, a difference in threshold voltages is also increased.

In the self-selecting memory device 100 according to an embodiment of the present inventive concept, a PCS material such as a Ge—Sb—Te alloy can be inserted as a resistor into a predominantly OTS structure. Accordingly, the self-selecting memory device 100 embodiment of the present inventive concept may secure a sensing window by increasing the threshold voltage (Vth) in state "1". In a self-selecting memory (SSM) method, the pulse polarity may be maintained during read and/or write operations.

The self-selecting memory device 100 of the present inventive concept may adjust a crystal phase of the PCS material by changing a pulse shape when a write voltage is applied. For example, in the case of state "0," the PCS material can be made into a crystalline state by having substantially the same polarity direction and relatively long write pulse width. In this case, the memory cell MC in the crystalline state is in a low-resistance state. In the case of state "1," the polarity directions are substantially opposite to each other and the write pulse width is relatively short, so that the PCS material can be made into an amorphous state. In this case, the memory cell MC in the amorphous state is in a high-resistance state. That is, in the case of state "1," the self-selecting memory device 100 of the present inventive concept can expect to secure a sensing window by increasing the threshold voltage (Vth).

Figure 2A:
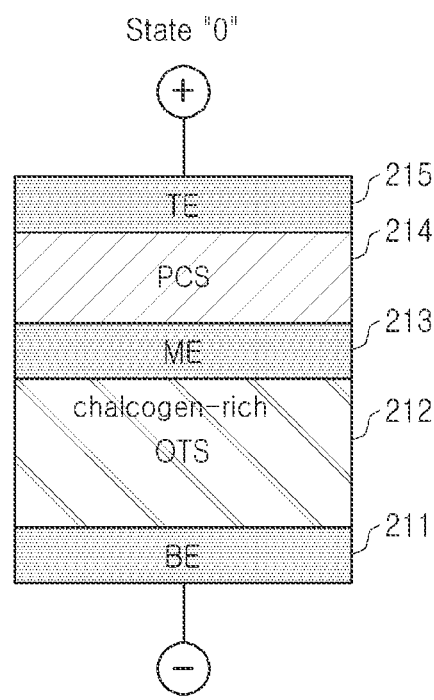
FIGS. 2A and 2B are hybrid cross-sectional diagrams illustrating states of memory cells MC according to an embodiment of the present inventive concept.
Figure 2B:
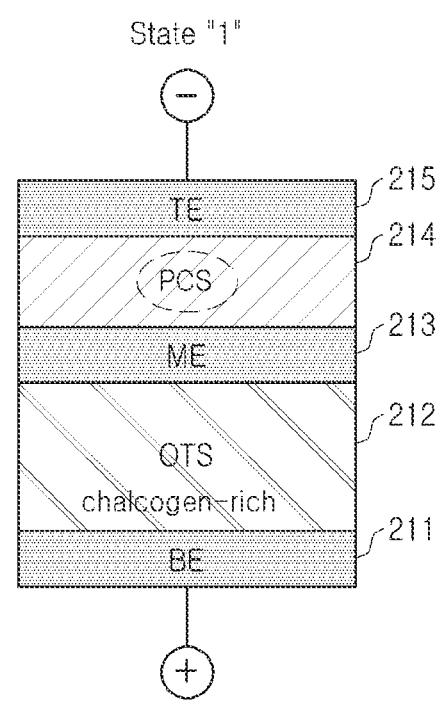

FIGS. 2A and 2B illustrate states of memory cells MC according to an embodiment of the present inventive concept.

Referring to FIG. 2A, the memory cell MC may include a lower electrode (BE) 211, a first chalcogenide layer such as an OTS layer 212, an intermediate electrode (ME) 213, a second chalcogenide layer such as a PCS material or Ge—Sb—Te alloy layer 214, and an upper electrode (TE) 215.

In an embodiment, during a write operation, the memory cell MC may have an electrical current direction of a reset write and an electrical current direction of a set write, substantially opposite to each other.

In an embodiment, at least one of the first chalcogenide layer 212 and/or the second chalcogenide layer 214 may include a storage material PCS material or a selection material OTS.

In an embodiment, the storage material may have a crystalline structure in an operation of the state "0" and an amorphous structure in an operation of the state "1". The storage material may comprise two or more elements among Ge, Te, and Sb. In addition, the storage material may include one or more elements of C, N, and O. For example, a storage material comprising a Ge—Sb—Te (GST) alloy may include at least one of Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or one or more chalcogenide materials, such as other materials that can be programmed to one of a plurality of states.

In an embodiment, the selection material OTS may comprise two or more elements among Ge, As, and Se. The selection material OTS may include one or more elements selected from among Si, In, Te, Sn, Ga, and N.

Figure 3A:
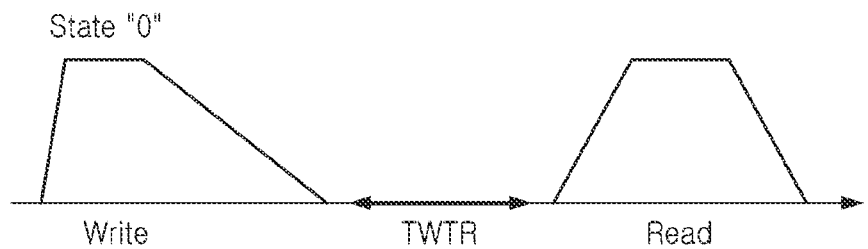
FIGS. 3A and 3B are signal timing diagrams illustrating a write pulse and a read pulse for each state according to an embodiment of the present inventive concept.
Figure 3B:
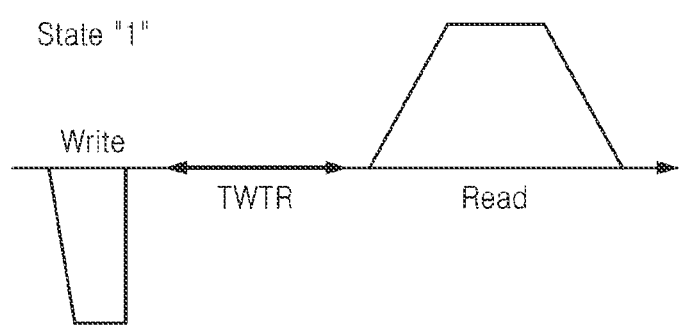

FIGS. 3A and 3B illustrate a write pulse and read pulse for each state according to an embodiment of the present inventive concept.

Referring to FIG. 3A, a write pulse in state "0" (set state, crystalline state), may have substantially the same direction as the read pulse. In state "0," a write pulse width can be greater than a reference pulse width. Here, the reference pulse width may be 100 ns. However, it should be understood that the present inventive concept is not limited to the reference pulse width.

Referring to FIG. 3B, a write pulse in state "1" (reset state, amorphous state) may have a direction substantially opposite to the read pulse. For example, the write pulse may have a negative level and the read pulse may have a positive level. In state "1," a write pulse width may be smaller than a reference pulse width (e.g., 100 ns).

Figure 4:
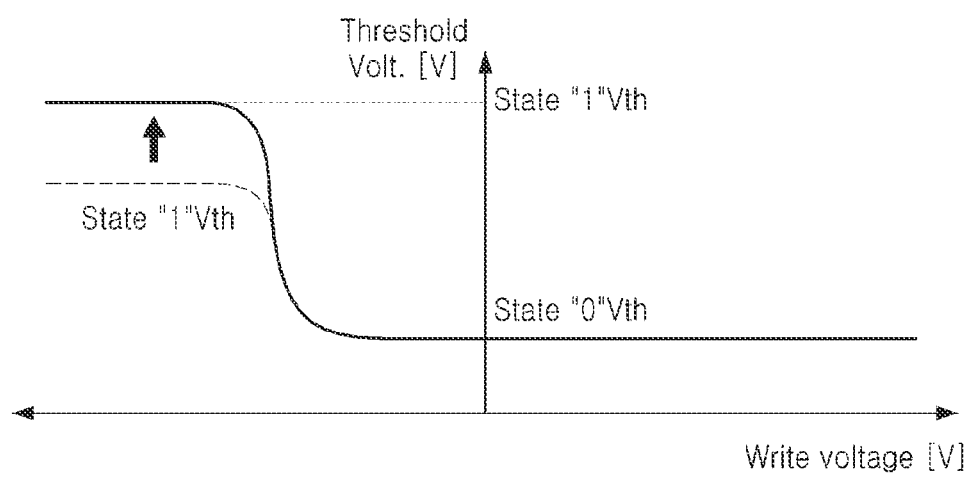
FIG. 4 is a graphical diagram illustrating expansion of a sensing window of a memory cell according to an embodiment of the present inventive concept.

FIG. 4 illustrates expansion of a sensing window of a memory cell according to an embodiment of the present inventive concept. Referring to FIG. 4, the memory cell of the present invention may additionally form a high-resistance state by making a write pulse width in a set state shorter than a write pulse width in a reset state. Accordingly, it is possible to additionally secure a sensing margin compared to other memory cells. Accordingly, a sensing window may be additionally secured in the set state.

Figure 5:
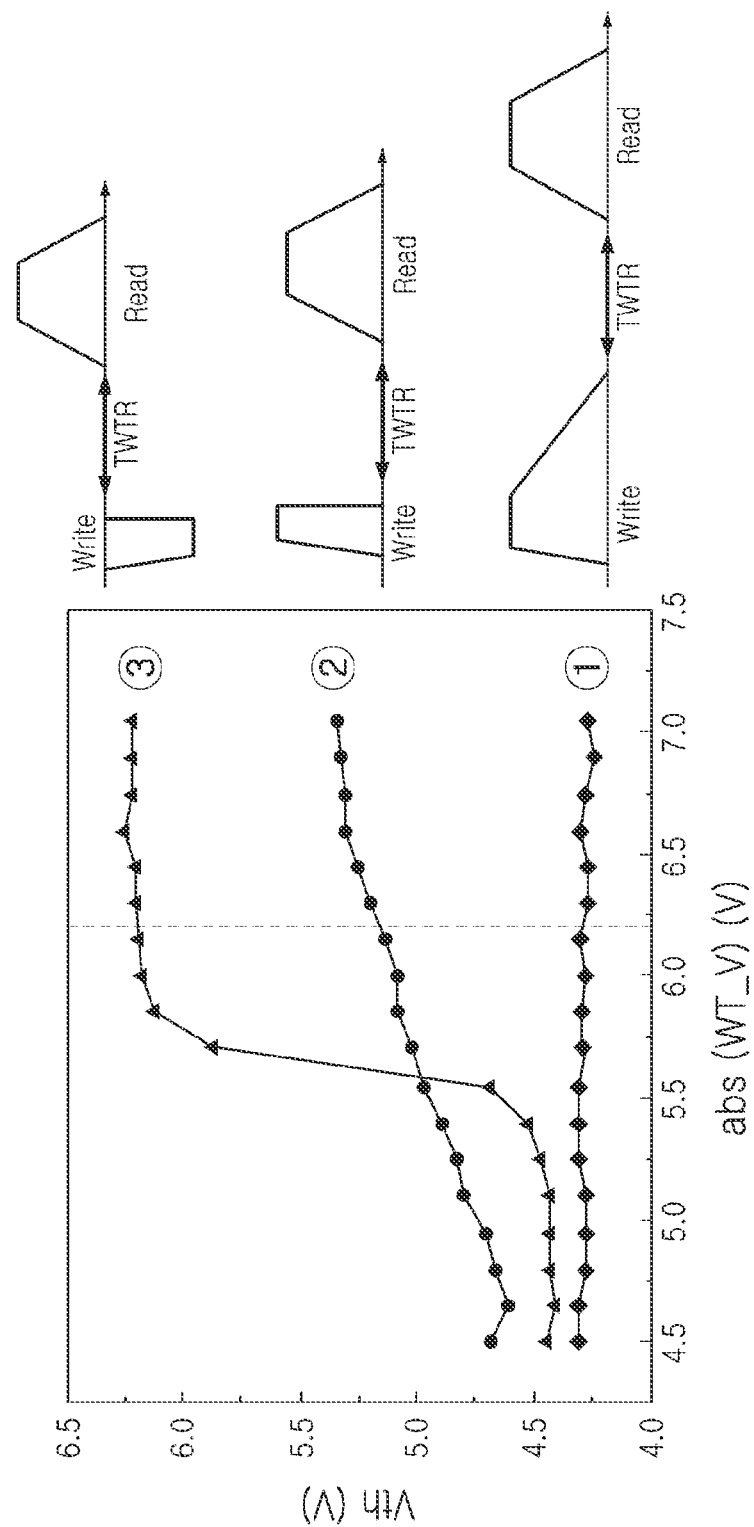
FIG. 5 is a graphical diagram illustrating a change in a threshold voltage according to control of a direction and shape of a pulse in a self-selecting memory device 100 according to an embodiment of the present inventive concept.

FIG. 5 illustrates a change in threshold voltage according to control of a direction and shape of a pulse in the self-selecting memory device 100 according to an embodiment of the present inventive concept.

In case of a first case (①), a write pulse and a read pulse are applied in substantially the same direction. OTS is in a LTS state. By applying a relatively long write pulse width, PCS material is in a crystalline state and has the lowest resistance. Therefore, the memory cell has a low threshold voltage (Vth). In case of a second case (②), a write pulse and a read pulse are applied in substantially the same direction. OTS is in a LTS state. Since a write pulse width is applied relatively short, PCS material is in an amorphous state with high resistance. Therefore, the memory cell has a high threshold voltage (Vth). In case of a third case (③), a write pulse and a read pulse are applied in substantially opposite directions. OTS is in a HTS state. Since a write pulse width is applied relatively short, PCS material is in an amorphous state with high resistance. Therefore, the memory cell has substantially the highest threshold voltage (Vth).

As described above, by adjusting a pulse polarity direction and pulse shape in the memory cell MC in an OTS+PCS material structure, a higher threshold voltage (Vth) in state "1" (case-③) may be applied.

Figure 6:
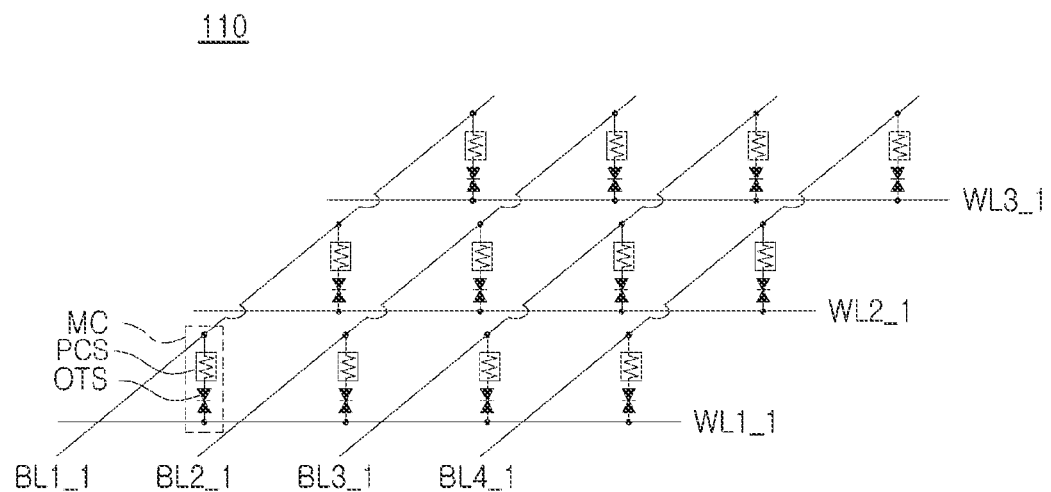
FIG. 6 is a circuit diagram illustrating a memory cell array 110 according to an embodiment of the present inventive concept.

FIG. 6 illustrates a memory cell array 110 according to an embodiment of the present inventive concept. Referring to FIG. 6, the memory cell array 110 may include a cross point structure. Here, the cross point structure refers to a structure in which one memory cell MC is formed in a region in which one line crosses another line. For example, the bit-lines BL1_1 to BL4_1 may be formed to extend in a first direction, the word-lines WL1_1 to WL3_1 may be formed to extend in a second direction to respectively cross the bit-lines BL1_1 to BL4_1, and a memory cell MC may be formed in a region in which the respective bit-lines BL1_1 to BL4_1 and the respective word-lines WL1_1 to WL3_1 cross each other.

In an embodiment, the memory cell MC may be a single level cell (SLC) storing one bit. In another embodiment, the memory cell MC may be a multilevel cell (MLC) capable of storing data of at least 2 bits or more. In another embodiment, a portion of memory cells MC may be single-level cells, and the other portion of memory cells MC may be multilevel cells.

The memory cell array 100 of the present inventive concept may include a cell array performing a buffer function.

Figure 7:
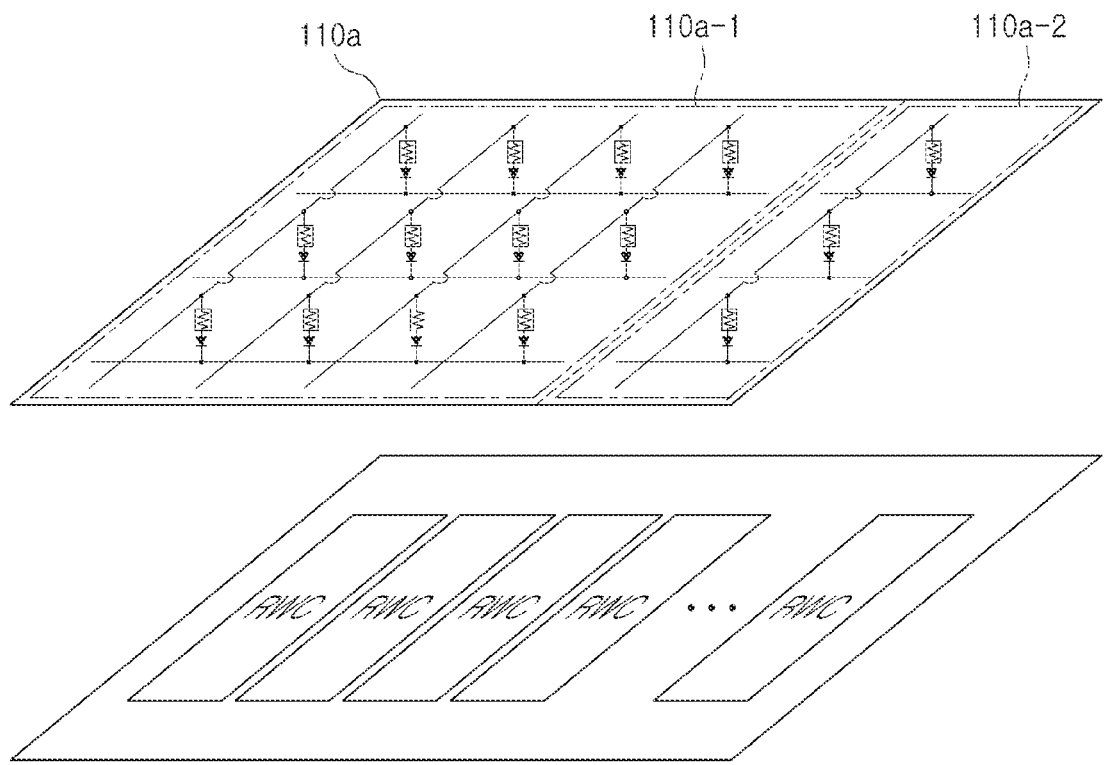
FIG. 7 is a hybrid circuit diagram illustrating a memory cell array 110a according to another embodiment of the present inventive concept.

FIG. 7 illustrates a memory cell array 110a according to another embodiment of the present inventive concept. Referring to FIG. 7, the memory cell array 110a may include a first memory cell array 110a-1 and a second memory cell array 110a-2. In an embodiment, the first memory cell array 110a-1 may serve as a main cell, and the second memory cell array 110a-2 may serve as a buffer. In an embodiment, the first memory cell array 110a-1 and the second memory cell array 110a-2 may perform a write operation according to different write modes.

In addition, as illustrated in FIG. 7, an RWC layer may be disposed below the memory cell array 110a. The RWC, layer may include the write circuit 140 and read circuit 150 of FIG. 1, and may perform a write operation and a read operation on a plurality of memory cells included in the memory cell array 110a. Although the RWC layer illustrated in FIG. 7 is located below the memory cell array 100a, it should be understood that the location of the RWC layer of the present inventive concept is not limited thereto.

The first memory cell array 111a and the second memory cell array 111b illustrated in FIG. 7 are disposed on substantially the same layer. However, the present inventive concept is not necessarily limited thereto. The first memory cell array and the second memory cell array of the present inventive concept may be disposed in different layers.

Figure 8:
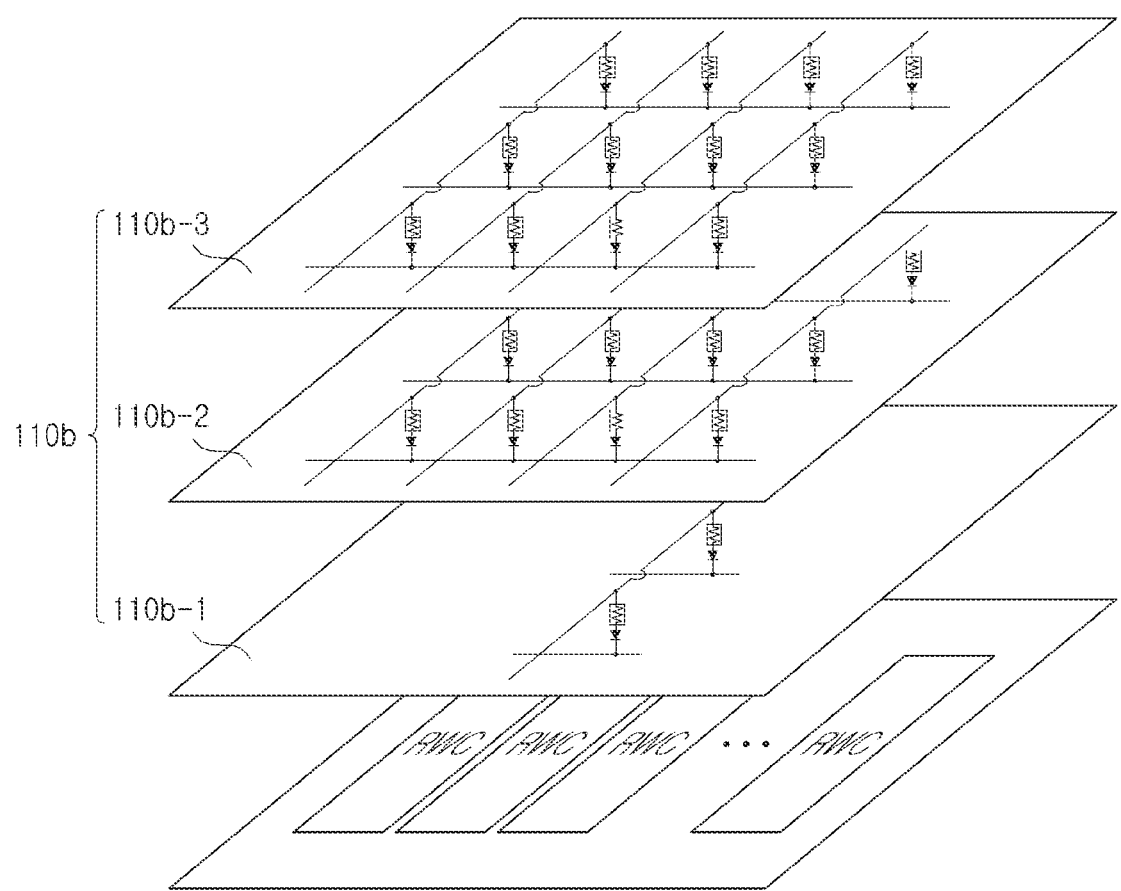
FIG. 8 is a hybrid circuit diagram illustrating a memory cell array 110b according to an embodiment of the present inventive concept.

FIG. 8 illustrates a memory cell array 110b according to another embodiment of the present inventive concept. Referring to FIG. 8, the memory cell array 110b may include a plurality of first memory cell arrays 110b-1 and 110b-2 disposed in different layers and a second memory cell array 110b-3 disposed in different layers from the plurality of first memory cell arrays 110b-1 and 110b-2.

In an embodiment, at least two of the first memory cell arrays 110b-1 and 110b-2 and the second memory cell array 110b-3 may perform a write operation according to different write modes.

Figure 9:
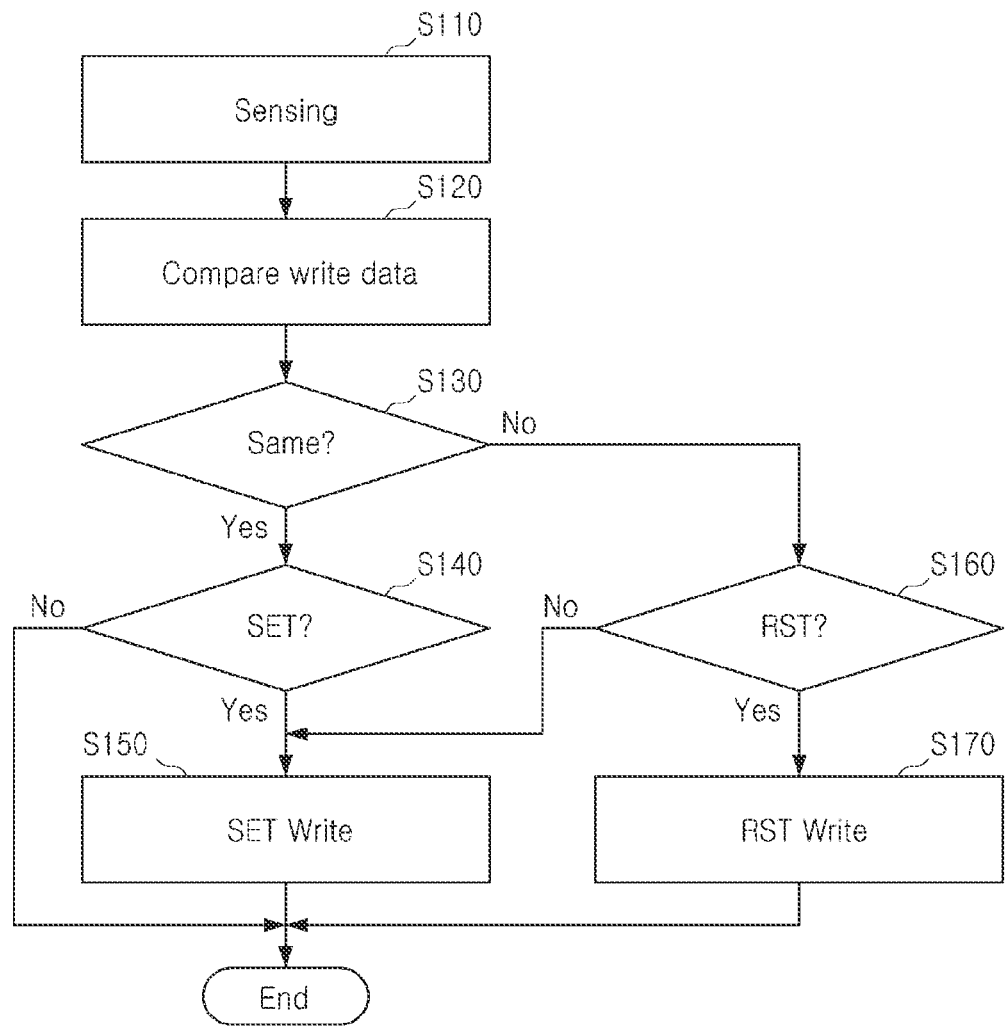
FIG. 9 is a flowchart diagram illustrating a write operation of the self-selecting memory device 100 according to an embodiment of the present inventive concept.

FIG. 9 illustrates a write operation of a self-selecting memory device 100 according to an embodiment of the present inventive concept. Referring to FIGS. 1 to 9, a write operation of the self-selecting memory device 100 may proceed as follows.

When a write command, address, and write data are received from the outside (e.g., from an external memory controller), a sensing operation may be performed on data of a memory cell corresponding to the address (S110). Write data D_WR and sensing data according to a sensing operation, that is, read data D_RD may be compared (S120). Thereafter, it may be determined whether the write data D_WR and the read data D_RD are substantially the same (S130). If the write data D_WR and the read data D_RD are substantially the same, it may be determined whether the write data D_WR is set data (S140). If the write data D_WR is set data, a set operation may be performed on the memory cell (S145). If the write data D_WR is not set data, the write operation may be immediately terminated.

If the write data D_WR and the read data D_RD are not substantially the same, it may be determined whether the write data D_WR is reset data (S160). If the write data D_WR is not reset data, a set operation may be performed on the memory cell (S150). In the set operation, a first write pulse corresponding to a first state may be applied. Here, a write pulse width of the first write pulse may be longer than a reference value. Here, the reference value may be 100 ns. If the write data D_WR is reset data, a reset operation may be performed on the memory cell (S170). In the reset operation, a second write pulse corresponding to the second state may be applied. Here, the write pulse width of the second write pulse may be shorter than a reference value.

The write operation according to an embodiment of the present inventive concept may simultaneously apply a read skip according to write data while using a data comparison write scheme.

Figure 10:
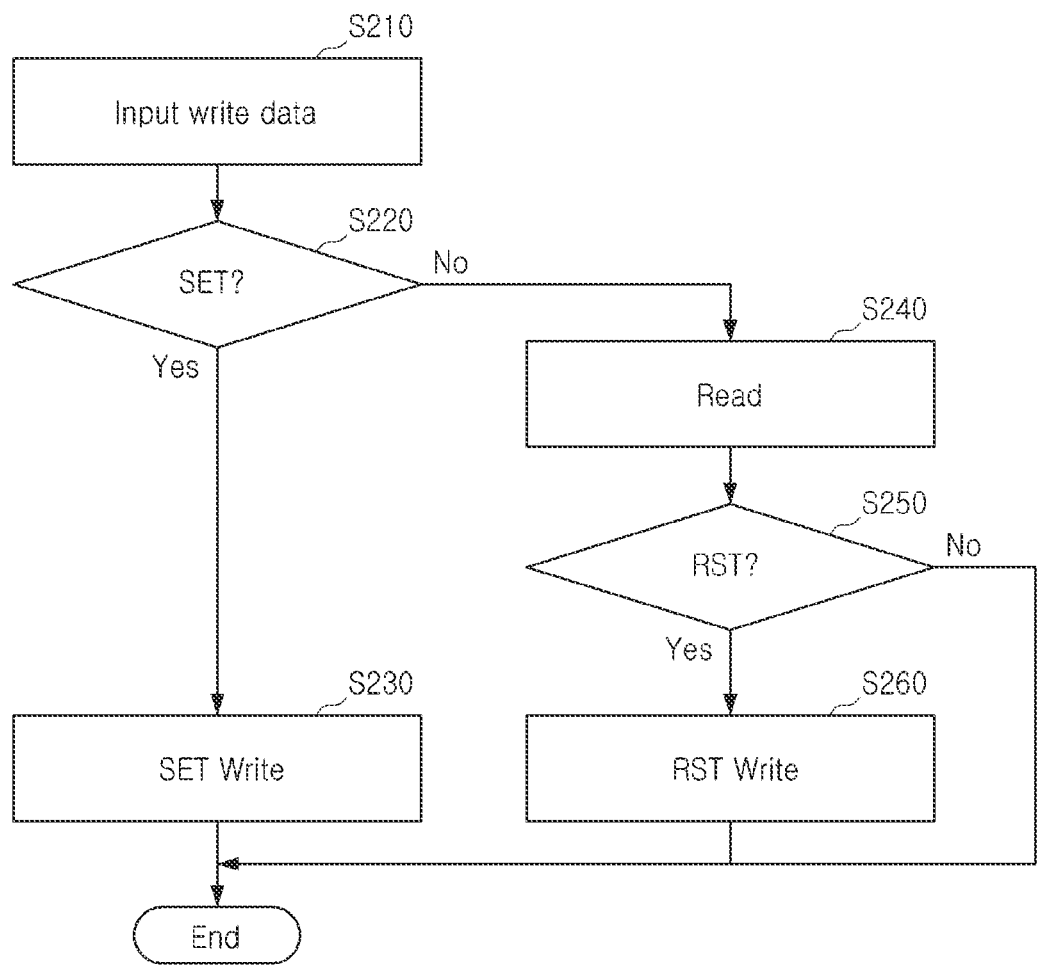
FIG. 10 is a flowchart diagram illustrating a write operation of the self-selecting memory device 100 according to an embodiment of the present inventive concept.

FIG. 10 illustrates a write operation of a self-selecting memory device 100 according to another embodiment of the present inventive concept. Referring to FIGS. 1 to 10, a write operation of the self-selecting memory device 100 may proceed as follows.

The self-selecting memory device 100 may receive a write command, write data, and an address from an outside (S210). First, it may be determined whether the write data D_WR is data '1' corresponding to a set state (S220). If the write data D_WR is '1', a set operation may be performed on a memory cell corresponding to an address without delay (S230). Here, the set operation may include an operation of applying a first write pulse corresponding to the first state. When the write data D_RD is data '0' corresponding to a reset state, a read operation may be performed from the memory cell corresponding to the address (S240). For example, such a read operation may be performed by a read voltage set equal to or higher than a read voltage in a normal mode.

Thereafter, it may be determined whether read data D_RD is in a reset state (S250). If the read data D_RD is in a reset state, a write operation is not performed. If the read data D_RD is not in a reset state, a reset operation may be performed on the memory cell (S260). Here, the reset operation may include an operation of applying a second write pulse corresponding to a second state.

Figure 11:
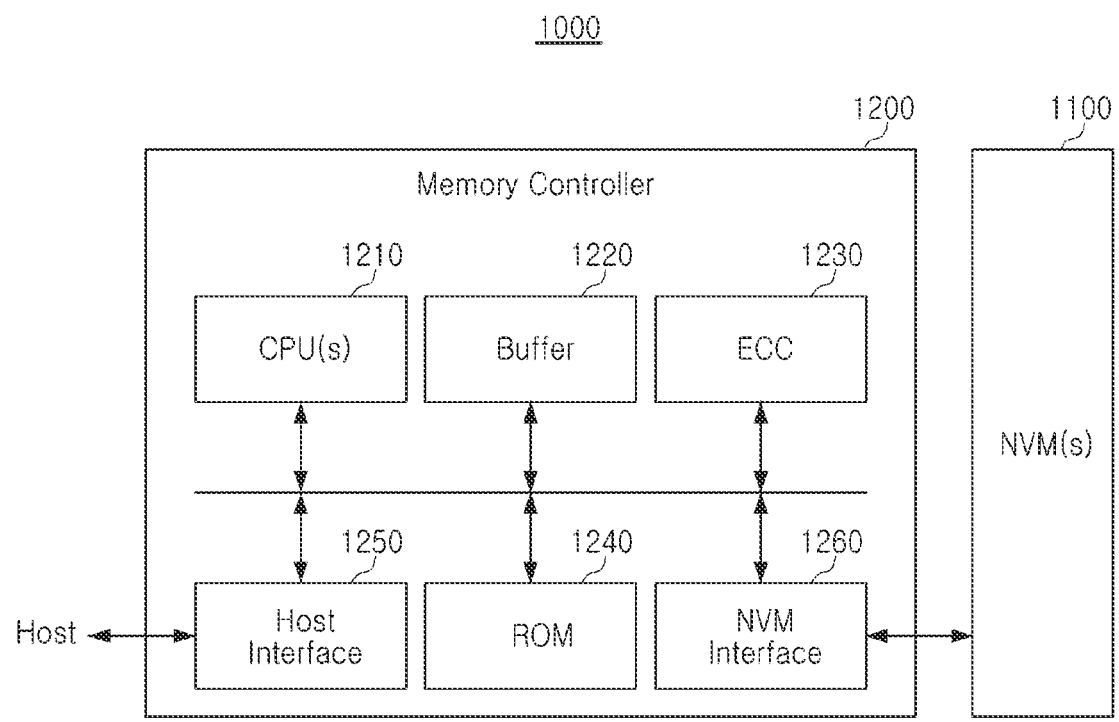
FIG. 11 is a block diagram illustrating a memory system 1000 according to an embodiment of the present inventive concept.

FIG. 11 illustrates a memory system 1000 according to an embodiment of the present inventive concept. Referring to FIG. 11, the memory system 1000 may include at least one self-selecting memory device (NVM) 1100 and a memory controller 1200.

At least one self-selecting memory device 1100 may be implemented by the self-selecting memory device described in FIGS. 1 to 10 and an operating method thereof, in order to reduce power consumption during a write operation and simultaneously optimize data reliability.

In an embodiment, in at least one self-selecting memory device 1100, polarities of a write pulse and a read pulse are different from each other according to a first state indicating a crystalline state and a second state indicating an amorphous state, and a PCS material (e.g., a Ge—Sb—Te alloy) crystal phase of the memory cell may be adjusted by changing a shape of the write pulse when a write voltage is applied. In an embodiment, a polarity direction of a first write pulse and a first read pulse may be substantially the same in the first state, and a polarity direction of a second write pulse and a second read pulse may be substantially opposite to each other in the second state. In an embodiment, a write pulse width of the first write pulse may be longer than a reference value, and a write pulse width of the second write pulse may be shorter than the reference value. In an embodiment, the reference value may be 100 ns. In an embodiment, when polarities of a write pulse and a read pulse are applied in substantially opposite directions to each of the plurality of memory cells, a region rich in selenium (Se-rich) may be formed in a direction in which electrons move. In an embodiment, the self-selecting memory device 1100 may be implemented to optionally receive an external high voltage Vpp.

The memory controller 1200 may be connected to the self-selecting memory device 1100. The SSD controller 1200 may include at least one processor (CPU(s)) 1210, a buffer memory 1220, an error correction circuit 1230, a code memory 1240, a host interface 1250, and a non-volatile memory interface 1260.

The processor 1210 may be implemented to control overall operations. The processor 1210 may be a central processing unit (CPU) or an application processor (AP).

The buffer memory 1220 may temporarily store data necessary for an operation of the memory controller 1200. The buffer memory 1220 illustrated in FIG. 11 is disposed inside the memory controller 1200, but it should be understood that the present disclosure is not limited thereto. The buffer memory 1220 of the present inventive concept may be disposed outside the memory controller 1200 as a separate intellectual property IP.

The error correction circuit 1230 may calculate an error correction code value of data to be programmed in a write operation, correct an error of data read in a read operation based on the error correction code value, and correct an error of data recovered from the self-selecting memory device 1100 in a data recovery operation. The error correction circuit 1230 may correct an error using a low density parity check (LDPC) code, a BCH code, a turbo code, a Reed-Solomon code, a convolution code, a recursive systematic code (RSC), and coded modulation such as trellis-coded modulation (TCM) and coded modulation such as block coded modulation (BCM). The code memory 1240 may store code data required for operating the memory controller 1200. Here, the code memory may be implemented as a self-selecting memory device. The host interface 1250 may provide an interface function with an external device. The non-volatile memory interface 1260 may provide an interface function with the self-selecting memory device 1100. The memory controller 1200 may be equipped with a wireless communication function (e.g., WiFi).

As described above, the memory system 1000 according to an embodiment of the present inventive concept includes a self-selecting memory device securing a sensing window through pulse control, thereby significantly optimizing system performance.

A self-selecting memory device according to an embodiment of the present inventive concept may be applied to a computing system.

Figure 12:
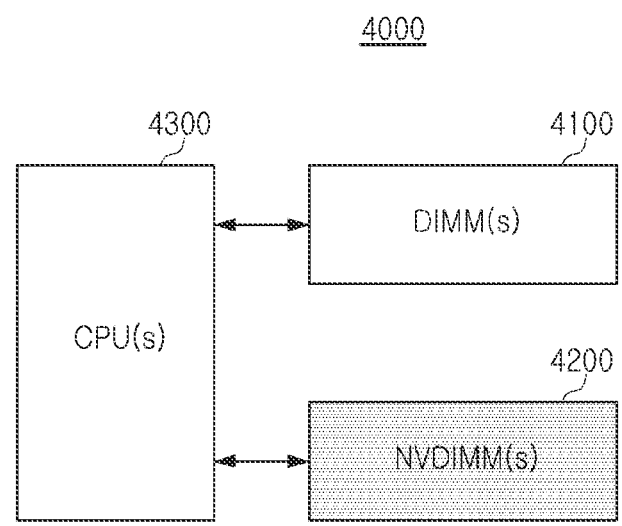
FIG. 12 is a block diagram illustrating a computing system 4000 according to an embodiment of the present inventive concept.

FIG. 12 illustrates a computing system 4000 according to an embodiment of the present inventive concept. Referring to FIG. 12, the computing system 4000 may include at least one memory module (DIMM) 4100, at least one non-volatile memory module (NVDIMM) 4200, and at least one processor 4300. Here, at least one non-volatile memory module 4200 may include the self-selecting memory device described above. Therefore, since the computing system 4000 of the present inventive concept increases data reliability and simultaneously reduces power consumption, economical management may be expected.

An existing PRAM includes PCS material, serving as a memory, and OTS, serving as a switch. In this case, in the case of PCS material, after being melted by receiving heat, different crystalline states are indicated, depending on a quenching state. In the case of State-"0" operation, a long pulse width is applied to form crystalline (low resistance)

through slow quenching. In the case of State-"1" operation, a short pulse width is applied to form amorphous (high resistance) through fast quenching.

In the case of self-selecting memory having a predominantly OTS structure without a Ge—Sb—Te alloy, OTS plays a role of memory and switch at substantially the same time. During memory operation, State-"0" and/or "1" is distinguished according to pulse polarities for write and read pulses. In the case of State-"0," the polarities for the write and read pulses are substantially the same, and in the case of State-"1," the polarities for the write and read pulses are substantially opposite to each other. When a voltage is applied to the OTS, a compositional asymmetry phenomenon occurs inside the OTS. When the polarities of write and read pulses are applied in substantially the opposite directions, a Se-rich region is formed in a direction in which electrons move, a high energy barrier is formed, so that high Vth is required. As a result, as a magnitude of a write voltage increases, a degree of Se asymmetry increases and delta Vth also increases.

The self-selecting memory according to an embodiment of the present inventive concept secures a sensing window by inserting PCS material as a resistor into a predominantly OTS structure to increase State-"1" Vth. During operation, in the case of pulse polarity, an SSM method is maintained, but a shape of the pulse is changed to adjust a crystalline phase of PCS material, when a write voltage is applied. For example, in the case of State-"0," the polarity direction lengthens the substantially same polarity write pulse width to switch the PCS material into a crystalline state and maintain a low resistance state; and in the state of State-"1," the polarity direction shortens a substantially opposite write pulse width to switch the PCS material into an amorphous state and form a higher resistance state. Thus, in State-"1," an additional Vth is increased and accordingly, a sensing window can be expanded.

The present inventive concept has been described by way of example with respect to specific illustrative embodiments thereof. The present inventive concept includes both technical and conceptual ideas that may be further utilized as technology evolves in the future, as well as concrete and practically usable means themselves.

As set forth above, according to an embodiment of the present inventive concept, in a self-selecting memory device, a memory system having the same, and an operating method thereof, by adding a chalcogenide layer, which may comprise a phase change material, a difference in resistance between substantially crystalline and substantially amorphous states may be increased.

In addition, according to an embodiment of the present inventive concept, in a self-selecting memory device, a memory system having the same, and an operating method thereof, by additionally increasing a threshold voltage Vth and controlling a pulse width, a sensing window may be increased.

Embodiments of the present inventive concept are not limited to the above description by way of example, and may be easily understood in the course of considering various other embodiments of the present inventive concept. While illustrative embodiments have been shown and described above, it will be apparent to those of ordinary skill in the pertinent art that various modifications and variations may be made without departing from the scope or spirit of the present inventive concept as set forth in the appended claims.

What is claimed is:

1. An operating method of a self-selecting memory device, comprising
    applying a first write pulse corresponding to a first state to a first memory cell during a first pulse width; and
    applying a second write pulse corresponding to a second state to a second memory cell during a second pulse width,
    wherein the first write pulse and the second write pulse have substantially opposite polarities,
    wherein the first pulse width is longer than the second pulse width,
    wherein each of the first memory cell and the second memory cell comprises:
    a lower electrode;
    a first chalcogenide layer disposed above the lower electrode;
    an intermediate electrode disposed above the first chalcogenide layer;
    a second chalcogenide layer disposed above the intermediate electrode; and
    an upper electrode disposed above the second chalcogenide layer,
    wherein one of the first chalcogenide layer and the second chalcogenide layer includes a storage material, and the other of the first chalcogenide layer and the second chalcogenide layer includes a selection material, and
    wherein the first chalcogenide layer is in direct contact with the lower electrode and the intermediate electrode, and the second chalcogenide layer is in direct contact with the intermediate electrode and the upper electrode.

2. The operating method of claim 1, wherein each of the first memory cell and the second memory cell includes a phase-change material.

3. The operating method of claim 1, wherein the storage material includes:
    at least two elements among Ge, Te, and Sb; and
    at least one element among C, N and O.

4. The operating method of claim 1, wherein the selection material includes:
    at least two elements among Ge, As, and Se; and
    at least one element among Si, In, Te, Sn, Ga, and N.

5. The operating method of claim 1,
    wherein the first write pulse corresponding to the first state and a first read pulse corresponding to the first state have substantially the same polarities,
    wherein the second write pulse corresponding to the second state and a second read pulse corresponding to the second state have substantially opposite polarities.

6. The operating method of claim 1, wherein the first pulse width is longer than 100 ns.

7. The operating method of claim 1, wherein the second pulse width is shorter than 100 ns.

8. The operating method of claim 1, wherein:
    the first state indicates a crystallization state, and
    the second state indicates an amorphous state.

9. A self-selecting memory device, comprising:
    word-lines;
    bit-lines; and
    a plurality of memory cells connected between the word-lines and the bit-lines,
    wherein each of the plurality of memory cells stores data in one of a first state indicating a crystallization state and a second state indicating an amorphous state,
    wherein a polarity direction of a second write pulse applied to a corresponding word-line and a corresponding bit-line when data is stored in the second state and a polarity direction of a first write pulse applied to a corresponding word-line and a corresponding bit-line when data is stored in the first state are substantially opposite to each other, wherein a pulse width of the second write pulse is shorter than a pulse width of the first write pulse, wherein each of the plurality of memory cells includes:
a lower electrode connected to a corresponding bit-line;
a first chalcogenide layer disposed above the lower electrode;
an intermediate electrode layer disposed above the first chalcogenide layer;
a second chalcogenide layer disposed above the intermediate electrode; and
an upper electrode disposed above the second chalcogenide layer, and connected to a corresponding word-line, wherein one of the first chalcogenide layer and the second chalcogenide layer includes a storage material, and the other of the first chalcogenide layer and the second chalcogenide layer includes a selection material, and wherein the first chalcogenide layer is in direct contact with the lower electrode and the intermediate electrode, and the second chalcogenide layer is in direct contact with the intermediate electrode and the upper electrode.

10. The self-selecting memory device of claim 9, wherein each of the plurality of memory cells includes a chalcogenide layer having a storage material or a selection material.

11. The self-selecting memory device of claim 9,
wherein each of the plurality of memory cells is implemented with an ovonic threshold switching (OTS) material and a phase-change storage material (PCS) material,
wherein the PCS material comprises a germanium-antimony-tellurium alloy.

12. The self-selecting memory device of claim 9, wherein:
polarities for a first read pulse corresponding to the first state and the first write pulse corresponding to the first state are substantially the same, and
polarities for a second read pulse corresponding to the second state and a second write pulse corresponding to the second state are substantially opposite to each other.

13. A memory system, comprising:
at least one self-selecting memory device; and
a controller configured to control the at least one self-selecting memory device,
wherein the at least one self-selecting memory device adjusts a crystalline phase of a memory cell by changing a shape of the write pulse when a write voltage is applied,
wherein polarities of the write pulse and a read pulse are different according to a first state indicating a crystalline state and a second state indicating an amorphous state,
wherein the memory cell comprises:
a lower electrode;
a first chalcogenide layer disposed above the lower electrode;
an intermediate electrode disposed above the first chalcogenide layer;
a second chalcogenide layer disposed above the intermediate electrode; and
an upper electrode disposed above the second chalcogenide layer,
wherein one of the first chalcogenide layer and the second chalcogenide layer includes a storage material, and the other of the first chalcogenide layer and the second chalcogenide layer includes a selection material, and
wherein the first chalcogenide layer is in direct contact with the lower electrode and the intermediate electrode, and the second chalcogenide layer is in direct contact with the intermediate electrode and the upper electrode.

14. The memory system of claim 13, wherein:
polarities for a first write pulse and a first read pulse in the first state are substantially the same, and
polarities for a second write pulse and a second read pulse in the second state are substantially opposite to each other.

15. The memory system of claim 14, wherein:
a write pulse width of the first write pulse is longer than a reference value, and
a write pulse width of the second write pulse is shorter than the reference value.

16. The memory system of claim 15, wherein the reference value is 100 ns.

17. The memory system of claim 13, wherein:
the memory cell comprises a germanium-antimony-tellurium alloy,
each of the plurality of memory cells includes a selenium-rich region formed therein in a direction in which electrons move when polarities of the write pulse and the read pulse are applied in substantially opposite directions.

* * * * *